(12) United States Patent
Lu et al.

(10) Patent No.: US 12,417,980 B2
(45) Date of Patent: Sep. 16, 2025

(54) FIRST METAL STRUCTURE, LAYOUT, AND METHOD

(71) Applicant: TAIWAN SEMICONDUCTOR MANUFACTURING COMPANY, LTD., Hsinchu (TW)

(72) Inventors: Chi-Yu Lu, Hsinchu (TW); Chih-Liang Chen, Hsinchu (TW); Chia-Tien Wu, Hsinchu (TW); Chih-Yu Lai, Hsinchu (TW); Shang-Hsuan Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 522 days.

(21) Appl. No.: 17/752,737

(22) Filed: May 24, 2022

(65) Prior Publication Data

US 2023/0387011 A1    Nov. 30, 2023

(51) Int. Cl.
*H01L 23/528*    (2006.01)
*G06F 30/392*    (2020.01)
*H01L 21/768*    (2006.01)
*H01L 23/522*    (2006.01)
*H10D 84/01*    (2025.01)
*H10D 84/03*    (2025.01)
*H10D 84/82*    (2025.01)

(52) U.S. Cl.
CPC ........ *H01L 23/5286* (2013.01); *G06F 30/392* (2020.01); *H01L 21/76897* (2013.01); *H10D 84/0123* (2025.01); *H10D 84/038* (2025.01); *H10D 84/82* (2025.01); *H01L 23/5226* (2013.01)

(58) Field of Classification Search
CPC ............... H10L 23/528; H01L 23/5286; H01L 23/5283; H01L 23/5226; H10D 84/0149; H10B 41/10; H10B 43/10; H10B 51/10; H10B 53/10
See application file for complete search history.

(56) References Cited

U.S. PATENT DOCUMENTS

| 11,107,721 | B2 | 8/2021 | Or-Bach et al. |
| 2012/0129301 | A1 | 5/2012 | Or-Bach et al. |
| 2020/0020699 | A1* | 1/2020 | Fujiwara ............ H01L 23/5286 |

FOREIGN PATENT DOCUMENTS

| TW | 201820541 | 6/2018 |
| TW | 20200915 | 2/2020 |

* cited by examiner

*Primary Examiner* — Thanhha S Pham
(74) *Attorney, Agent, or Firm* — Hauptman Ham, LLP

(57) ABSTRACT

An integrated circuit (IC) structure includes two active areas extending in a first direction, two gate structures extending in a second direction, a first metal segment extending in the second direction in a first metal layer, second and third metal segments extending in the first direction in a second metal layer, and a gate via structure extending from the third metal segment to one of the gate structures. The gate structures overlie the active areas, the first metal segment overlies each of the active areas between the gate structures, the second metal segment overlies a first active area and overlies and is electrically connected to the first metal segment, and the first and second metal segments are electrically connected to the second active area, isolated from the first active area between the gate structures, and connected to the first active area outside the gate structures.

20 Claims, 15 Drawing Sheets

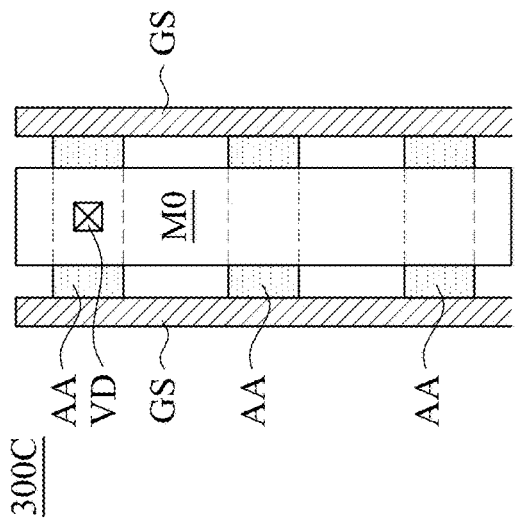
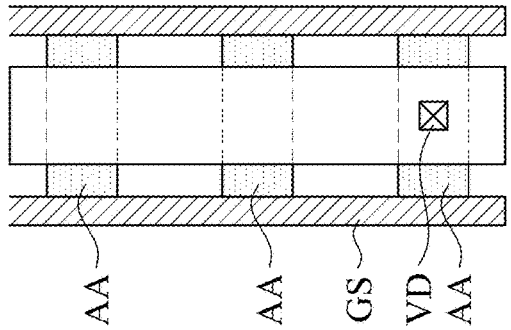
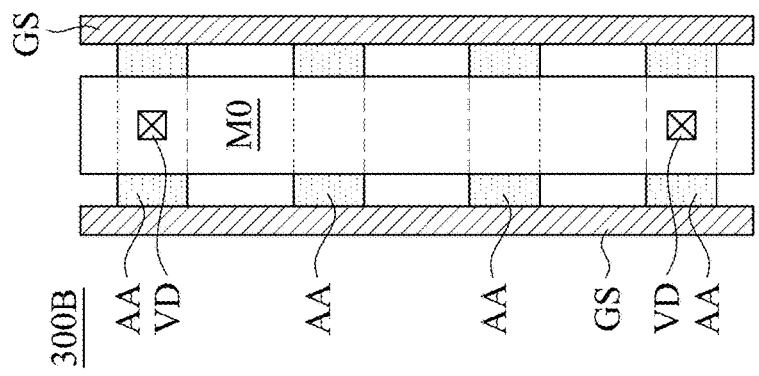
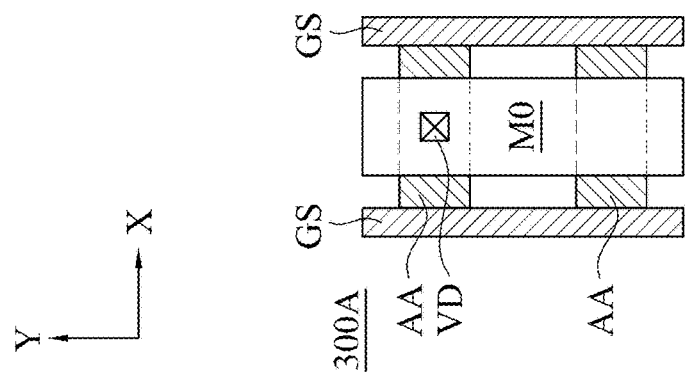
FIG. 3A
FIG. 3B
FIG. 3C

1000

1010 → Form first and second active areas extending in a first direction

1020 → Construct first and second gate structures extending in a second direction and overlying each of the first and second active areas 1030 → Form S/D via structures on a portion of the first active area between the first and second gate structures and on a portion of the second active area extending away from the first and second gate structures 1040 → Construct an electrical connection between the corresponding portions of the first and second active areas 1050 → Form a self-aligned contact (SAC) via structure overlying one of the first or second gate structures 1060 → Form one or more of additional active areas, additional gate structures, additional metal segments, additional via structures, or backside power rails

FIG. 10

FIRST METAL STRUCTURE, LAYOUT, AND METHOD

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are plan views of IC layout diagrams and corresponding IC structures, in accordance with some embodiments.

FIG. 10 is a flowchart of a method of manufacturing an IC structure, in accordance with some embodiments.

DETAILED DESCRIPTION

Figure 1A:
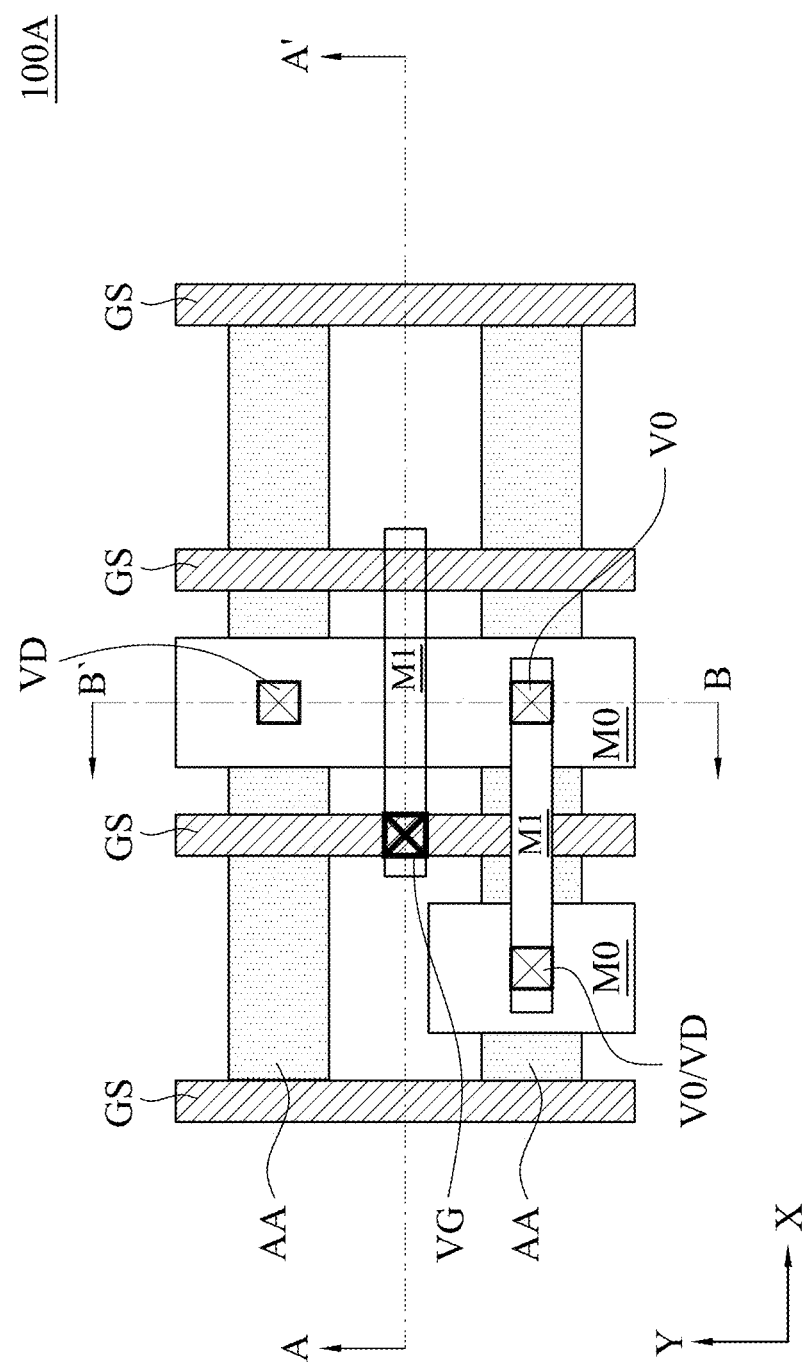
FIGS. 1A and 1B are plan views of IC layout diagrams and corresponding IC structures, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC structure based on an IC layout diagram includes a first metal segment in first metal layer overlying a portion of an active area between adjacent gate structures, e.g., a portion including a source/drain (S/D) structure. The first metal segment extends in a same direction as the gate structures and is included in an electrical path separate from a path that includes the active area portion, e.g., a series transistor connection or a back-side power supply connection. The electrical path also includes a second metal segment of a second metal layer overlying the first metal layer and extending perpendicularly to the first metal segment, and the IC structure includes a self-aligned contact (SAC) via structure that electrically connects a gate structure to a third metal segment of the second metal layer.

By including the first metal segment aligned with the gate structures, the perpendicular second and third metal segments, and the SAC via structure, the IC structure is capable of being included in electrical connections of IC devices, e.g., logic devices and flip-flop circuits, that do not include metal-like defined (MD) segments, thereby reducing costs and increasing routing flexibility compared to approaches that do not include the features of the various embodiments.

As discussed below, FIGS. 1A-9 depict plan and cross-sectional views in some embodiments. Each of FIGS. 1A-9 is a structure/layout diagram in which the reference designators represent both IC structure features and the IC layout features used to at least partially define the corresponding IC structure features in a manufacturing process, e.g., a method 1000 discussed below with respect to FIG. 10 and/or an IC manufacturing flow associated with an IC manufacturing system 1300 discussed below with respect to FIG. 13. In some embodiments, one or more of FIGS. 1A-9 is some or all of an IC layout diagram generated by executing some or all of the operations of a method 1100 discussed below with respect to FIG. 11. Accordingly, each of FIGS. 1A-9 represents a plan or cross-sectional view of both an IC layout diagram and a corresponding IC structure.

Each of the figures herein, e.g., FIGS. 1A-9, is simplified for the purpose of illustration. The figures are views of IC layout diagrams, structures, and devices with various features included and excluded to facilitate the discussion below. In various embodiments, an IC structure, device and/or layout diagram includes one or more features corresponding to power distribution structures, metal interconnects, contacts, vias, gate structures, source/drain (S/D) structures, or other transistor elements, isolation structures, or the like, in addition to the features depicted in FIGS. 1A-9.

FIGS. 1A-3C are diagrams of IC layouts/structures 100A-300C including one or more instance(s) of portions of an active region/area AA between two gate regions/structures GS and electrically isolated from an overlying metal region/segment M0 of a first metal layer. Each of IC layouts/structures 100A and 100B also includes metal regions/segments M1 of a second metal layer electrically connected to the metal region/segment M0 through a via region/structure V0 and to a gate region/structure GS through a gate via region/structure VG. FIGS. 4-9 are diagrams of IC layouts/devices 400-900 corresponding to logic devices and flip-flop circuits including the features of IC layouts/structures 100A-300C.

In addition to a corresponding one of IC layouts/structures 100A-300C or IC layouts/devices 400-900, each of FIGS. 1A-9 depicts two of directions X, Y, or Z in accordance with the diagram perspective.

An active region, e.g., active region/area AA or AA1-AA4 discussed below, is a region in the IC layout diagram included in the manufacturing process as part of defining an active area, also referred to as an oxide diffusion or definition (OD), in a semiconductor substrate, e.g., a substrate SUB discussed below, either directly or in an n-well or p-well region/area (not shown for the purpose of clarity), in which one or more IC device features, e.g., a S/D structure, is formed. In some embodiments, an active area is an n-type or p-type active area of a planar transistor structure, a fin field-effect transistor (FinFET) structure, a gate-all-around (GAA) transistor structure, a nanosheet structure, or a nanowire structure. In various embodiments, an active area (structure) includes one or more of a semiconductor material, e.g., silicon (Si), silicon-germanium (SiGe), silicon-carbide (SiC), or the like, a dopant material, e.g., boron (B), phosphorous (P), arsenic (As), gallium (Ga), or another suitable material.

In some embodiments, a nano-sheet structure includes a continuous volume of one or more layers of one or more semiconductor materials having either n-type or p-type doping. In various embodiments, individual nano-sheet layers include a single monolayer or multiple monolayers of a given semiconductor material. In some embodiments, an active area, e.g., a nanosheet structure, includes one or more epitaxial layers, e.g., an epitaxial layer EPI discussed below.

In the various embodiments depicted in FIGS. 1A-9, some or all of the active region/area portions between overlapping/overlying adjacent gate regions/segments correspond to S/D structures that are not further depicted for the purpose of clarity.

A gate region, e.g., gate region/structure GS or a gate region/structure of pluralities of gate regions/structures G1-G14 discussed below, is a region in the IC layout diagram included in the manufacturing process as part of defining a gate structure. A gate structure is a volume including one or more conductive segments, e.g., a gate electrode, including one or more conductive materials, e.g., polysilicon, copper (Cu), aluminum (Al), tungsten (W), titanium (Ti), nickel (Ni), tin (Sn), cobalt (Co), ruthenium (Ru), silver (Ag), or one or more other metals or other suitable materials, substantially surrounded by one or more insulating materials, the one or more conductive segments thereby being configured to control a voltage provided to an adjacent gate dielectric layer.

A dielectric layer, e.g., a gate dielectric layer, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide ($TiO_2$), suitable for providing a high electrical resistance between IC structure elements, i.e., a resistance level above a predetermined threshold corresponding to one or more tolerance levels of a resistance-based effect on circuit performance.

Pluralities of gate regions/structures G1-G14 have configurations along the Y direction in accordance with cut-gate regions (not depicted for the purpose of clarity), also referred to as cut-poly regions in some embodiments. A cut-gate region is a region in the IC layout diagram included in the manufacturing process as part of defining a discontinuity in the gate electrode of a given gate structure, thereby electrically isolating the corresponding adjacent portions of the gate electrode from each other.

A metal region, e.g., a metal region/segment M0, M1, or metal region/portion of pluralities of metal regions/segments 01-013, or a power rail PR or PR1-PR3 discussed below, is a region in the IC layout diagram included in the manufacturing process as part of defining a metal segment structure including one or more conductive materials in a given metal layer of the manufacturing process suitable for providing a low resistance electrical connection between IC structure elements, i.e., a resistance level below a predetermined threshold corresponding to one or more tolerance levels of a resistance-based effect on circuit performance.

In the embodiments depicted in FIGS. 1A-9, instances of metal regions/segments M0 and 01-013 extend in the Y direction in the first metal layer, also referred to as a metal zero layer in some embodiments. Instances of metal regions/segments M1 extend in the X direction in the second metal layer, also referred to as a metal one layer in some embodiments, and in the embodiment depicted in FIG. 9, instances of metal regions/segments M2 extend in the Y direction in the third metal layer, also referred to as a metal two layer in some embodiments.

In the embodiments depicted in FIGS. 1A-9, metal regions/segments M0, 01-013, and M2 extending in the Y direction corresponds to metal regions/segments M0, 01-013, and M2 extending in a same direction as gate regions/structures GS and G1-G14, and metal regions/segments M1 extending in the X direction (perpendicular to the Y direction) corresponds to metal regions/segments M1 extending in a same direction as active regions/areas AA and AA1-AA4. In some embodiments, metal regions/segments M0, 01-013, and M2 and gate regions/structures GS and G1-G14 extend in the same direction being a first other, e.g., X, direction, and metal regions/segments M1 and active regions/areas AA and AA1-AA4 extend in the same second other, e.g., Y, direction perpendicular to the first other direction.

In the embodiments depicted in FIGS. 1A-9, each of power rails PR, and PR1-PR3, also referred to as backside power rails PR and PR1-PR3, corresponds to one or more metal layers formed in a back side of the semiconductor substrate as part of a backside manufacturing process. In the various embodiments discussed below, a given one of power rails PR or PR1-PR3 is configured to carry either a power supply voltage VDD or a power supply reference voltage VSS.

A via region, e.g., a via region/structure VD, VG, V0, V1, or VB discussed below, is a region in the IC layout diagram included in the manufacturing process as part of defining a via structure including one or more conductive materials configured to provide an electrical connection between an overlying conductive structure and an underlying conductive structure. In the case of a via region/structure VD, the overlying conductive structure corresponds to a metal segment M0 and the underlying conductive structure corresponds to an active region/area AA or AA1-AA4. In the case of a via region/structure V0, the overlying conductive structure corresponds to a metal segment M1 and the underlying conductive structure corresponds to a metal region/segment M0, and in the case of a via region/structure V1, the overlying conductive structure corresponds to a metal segment M2 and the underlying conductive structure corresponds to a metal region/segment M1.

In the case of a via region/structure VG, the overlying conductive structure corresponds to a metal segment M1 and the underlying conductive structure corresponds to a gate region/structure GS or G1-G14. A given via region VG thereby corresponds to a SAC region in the IC layout diagram that at least partially defines the corresponding via structure VG extending in the Z direction directly from a gate structure to the second metal layer and free from including a metal region/segment M0 in the first metal layer. In some embodiments, a via region/structure VG is referred to as a long via.

In the case of a via region/structure VB, the overlying conductive structure corresponds to an active region/area AA or AA1-AA4 and the underlying conductive structure corresponds to a power rail PR or PR1-PR3. A given via region VB thereby corresponds to a region in the IC layout diagram that at least partially defines the corresponding via structure VB extending from an active area positioned on a front side of the semiconductor substrate through the semiconductor substrate to a backside power rail, whereas each of via regions VD, V0, V1, and VG corresponds to a region in the IC layout diagram that at least partially defines the corresponding via structure VD, V0, V1, or VG extending between two features positioned on the front side of the semiconductor substrate.

Figure 1B:
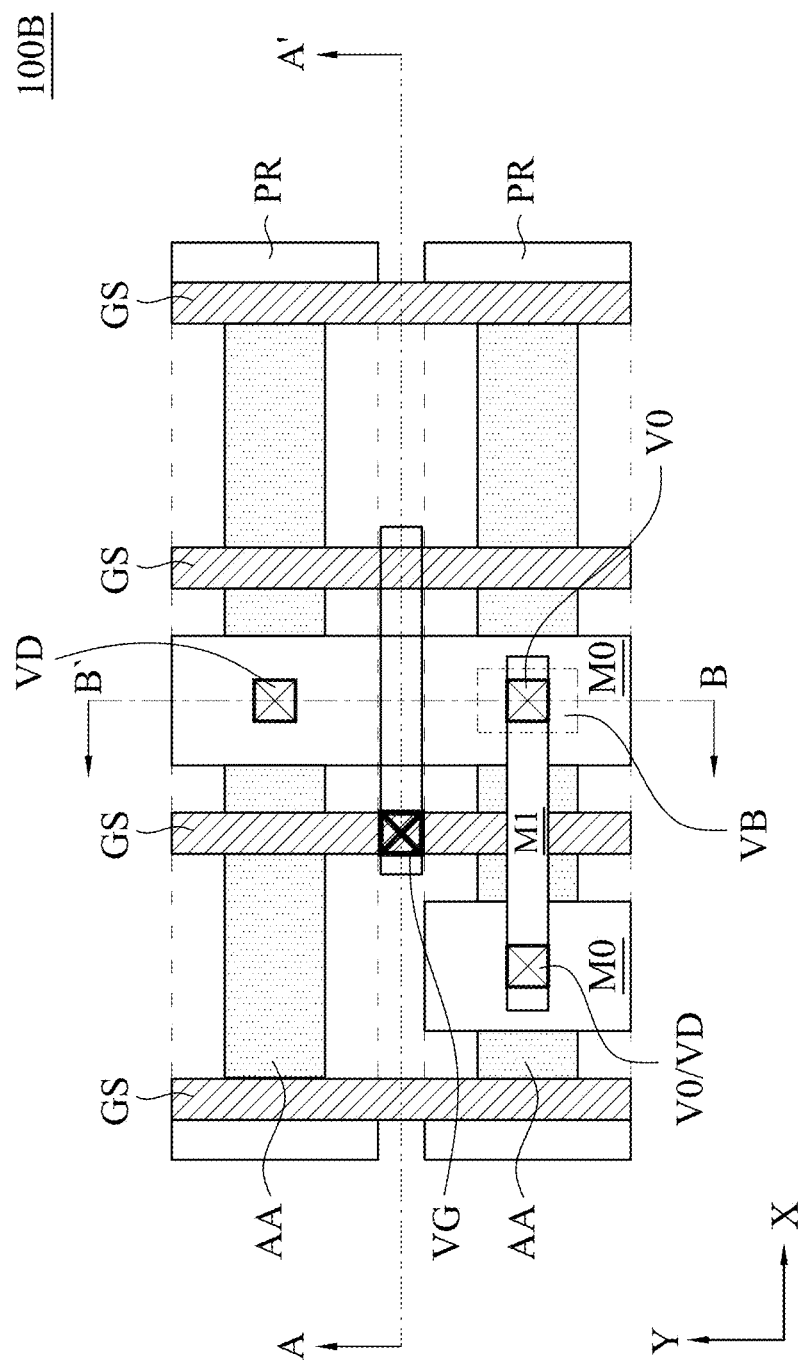

FIGS. 1A and 1B depict plan views of respective IC layouts/structures 100A and 100B, in accordance with some embodiments. Each of IC layouts/structures 100A and 100B includes two instances of active region/area AA extending in the X direction in semiconductor substrate SUB, four instances of gate region/structure GS extending in the Y direction and overlying each instance of active region/area AA, two instances of metal region/segment M0 extending in the Y direction, two instances of metal region/segment M1 extending in the X direction, two instances of each of via regions/structures VD and V0, and a via region/structure VG. IC layout/structure 100B also includes two instances of power rails PR and a via region/structure VB.

In each of IC layouts/structures 100A and 100B, a first metal region/segment M0 overlies each active region/area AA between adjacent gate regions/structures GS, and is electrically connected to a portion of a first active region/area AA between the adjacent gate regions/structures GS through a via region/structure VD and to an overlying metal region/segment M1 through a via V0. The overlying metal region/segment M1 is electrically connected to a portion of a second active region/area AA extending away from the adjacent gate regions/structures GS through a via region/structure V0, a second metal region/segment M0, and a via region/structure VD.

The first metal region/segment M0 and overlying metal region/segment M1 are thereby configured as part of an electrical connection between the portion of the first active region/area AA between the adjacent gate regions/structures GS and the portion of the second active region/area AA extending away from the adjacent gate regions/structures GS. The electrical path is electrically isolated from a portion of the second active region/area AA between the adjacent gate regions/structures GS.

In IC layout/structure 100A, the portion of the second active region/area AA between the adjacent gate regions/structures GS corresponds to a shared S/D terminal of two transistors (not labeled) corresponding to the locations at which the adjacent gate regions/structures GS overlap/overlie the second active region/area AA. The two transistors are a same transistor type, either an n-type metal oxide semiconductor (NMOS) transistor or a p-type metal oxide semiconductor (PMOS) transistor.

In IC layout/structure 100B, the portion of the second active region/area AA between the adjacent gate regions/structures GS corresponds to a power supply connection to the underlying power rail PR through via region/structure VB.

In each of IC layouts/structures 100A and 100B, a second metal region/segment M1 is electrically connected to an underlying gate region/structure GS though via region/structure VG. The second metal region/segment M1 is electrically isolated from the first metal region/structure M0 and, in the embodiments depicted in FIGS. 1A and 1B, overlies the first metal region/structure M0. In some embodiments, the second metal region/segment M1 does not overlie the first metal region/structure M0.

Figure 2A:
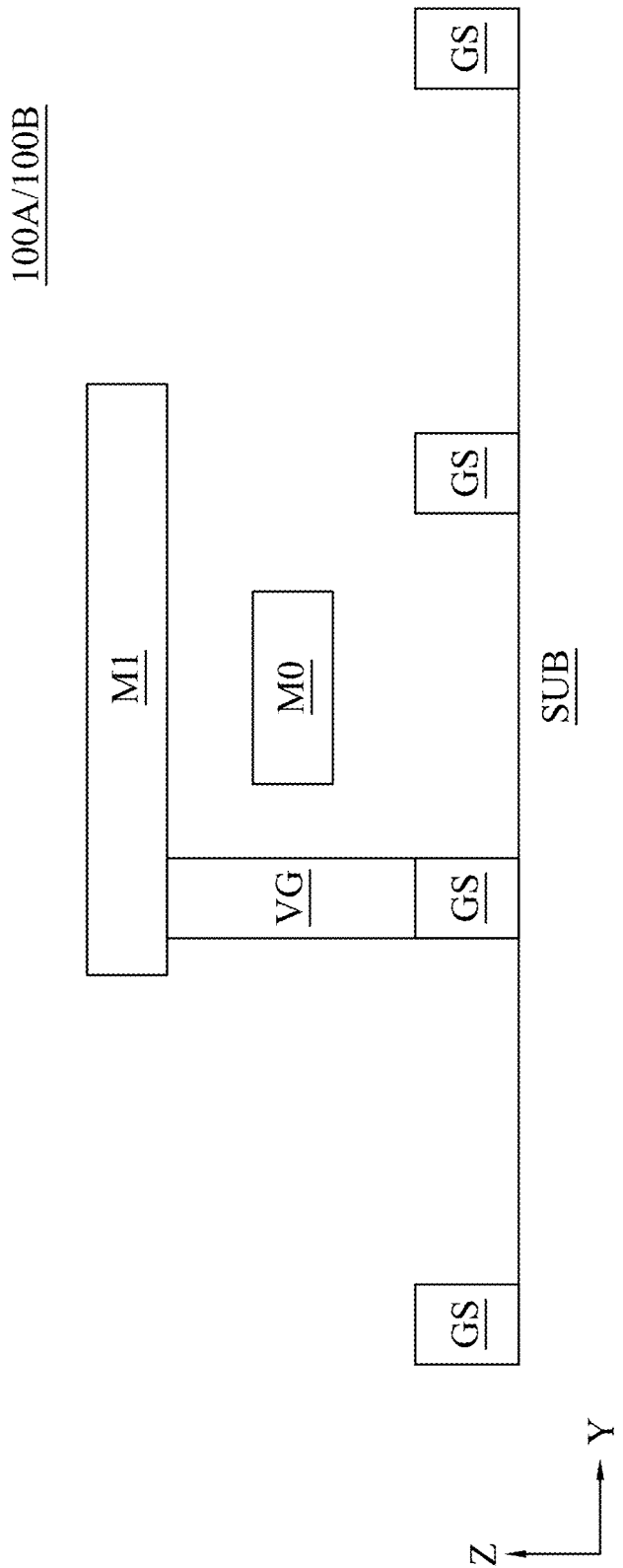
FIGS. 2A and 2B are cross-sectional views of IC layout diagrams and corresponding IC structures, in accordance with some embodiments.
Figure 2B:
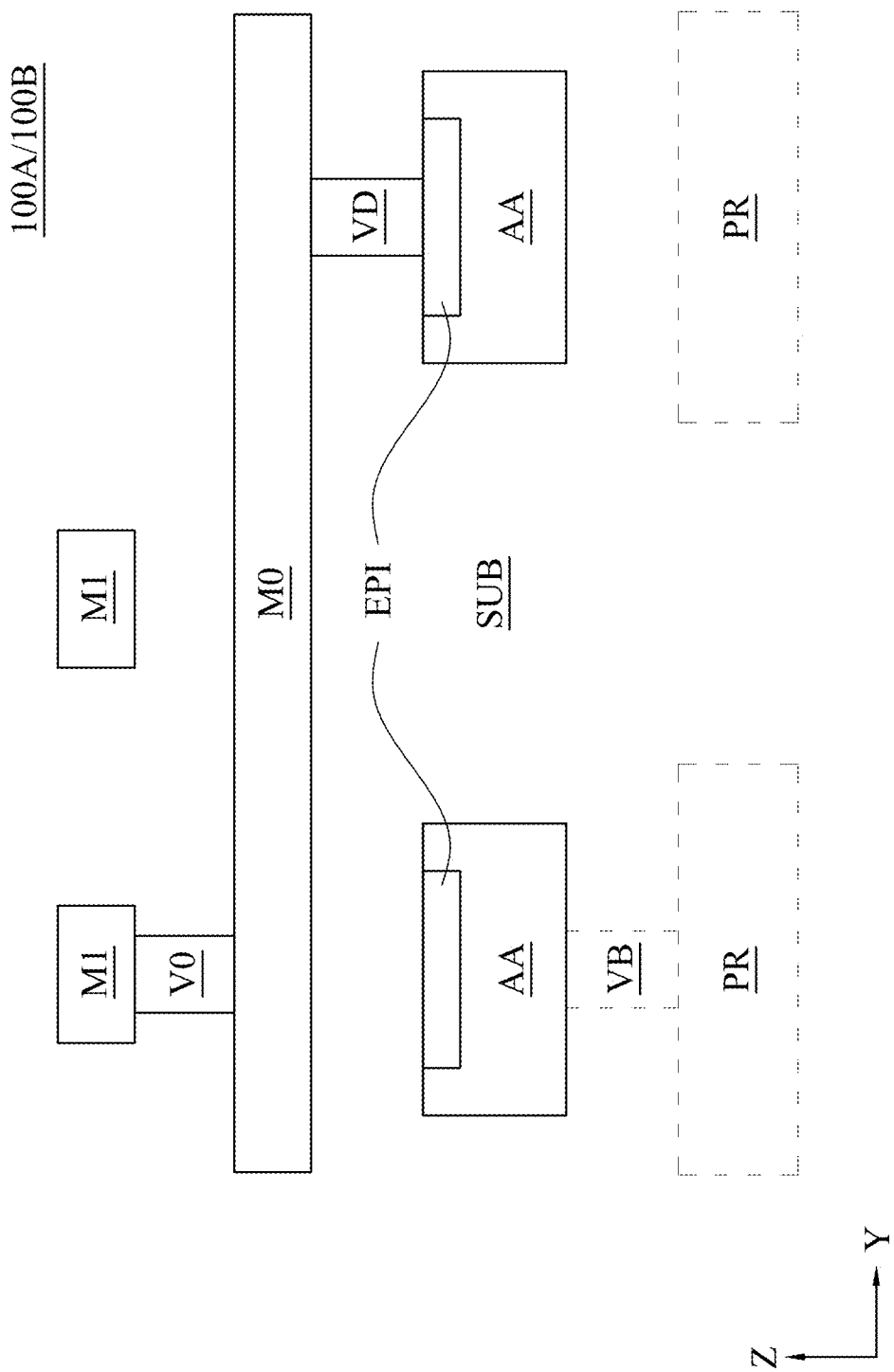

FIGS. 2A and 2B depict cross-sectional views of IC layouts/structures 100A and 100B, in accordance with some embodiments. FIG. 2A corresponds to an X-Z plane indicated by line A-A' in FIGS. 1A and 1B, and FIG. 2B corresponds to an Y-Z plane indicated by line B-B' in FIGS. 1A and 1B.

FIG. 2A depicts the second metal region/segment M1 electrically connected to the underlying gate region/structure GS though via region/structure VG and electrically isolated from the underlying first metal region/structure M0 in each of IC layouts/structures 100A and 100B.

FIG. 2B depicts, in each of IC layouts/structures 100A and 100B, the first metal region/segment M0 electrically connected to the portion of the first active region/area AA between the adjacent gate regions/structures GS through via region/structure VD and to the overlying metal region/segment M1 through via V0, and electrically isolated from each of the overlying second metal region/segment M1 and the underlying portion of the second active region/area AA between the adjacent gate regions/structures GS.

In IC layout/structure 100A, the portion of the second active region/area AA between the adjacent gate regions/structures GS corresponding to the shared S/D terminal corresponds to the cross-sectional view depicted in FIG. 2B not including via region/structure VB and, in some embodiments, power rails PR, each represented by dashed lines. In IC layout/structure 100B, the portion of the second active region/area AA between the adjacent gate regions/structures GS corresponding to the power supply connection corresponds to the cross-sectional view depicted in FIG. 2B including via region/structure VB and power rails PR.

In the embodiments depicted in FIGS. 2A and 2B, each of IC layouts/structures 100A and 100B includes active regions/areas AA including epitaxial layers EPI. In some embodiments, one or both of IC layouts/structures 100A or 100B includes active regions/areas AA free from including epitaxial layers EPI.

Each of IC layouts/structures 100A and 100B is thereby configured to include metal regions/structures M0 and M1 in an electrical path between first portions of active regions/areas AA and electrically isolated from a second portion of an active region/area AA and from a gate via region/structure VG and corresponding metal region/structure M1. In various embodiments, one or both of IC layouts/structures 100A and 100B is otherwise configured, e.g., by including the first metal region/segment M1 overlying more than one gate structure GS, such that an electrical path between first portions of active regions/areas AA is electrically isolated from the corresponding features.

By including metal regions/segments M0 aligned with gate regions/structures GS, perpendicular metal regions/segments M1, and via region/structure VG, each of IC layouts/structures 100A and 100B is capable of being included in electrical connections of IC devices that do not include MD segments, thereby reducing costs and increasing routing flexibility compared to approaches that do not include the features of the various embodiments.

FIGS. 3A-3C depict plan views of respective IC layouts/structures 300A-300C, in accordance with some embodiments. Each of IC layouts/structures 300A-300C includes metal region/segment M0 extending in the Y direction between instances of gate regions/structures GS.

IC layout/structure 300A also includes two instances of active region/area AA and a via region/structure VD. Metal region/segment M0 and via region/structure VD are thereby configured as an electrical path to a portion of a first active region/area AA separate from the portion of a second active region/area AA overlapping/underlying metal region/segment M0.

IC layout/structure 300B also includes four instances of active region/area AA and two instances of via region/structure VD. Metal region/segment M0 and the two instances of via region/structure VD are thereby configured as an electrical path between first portions of two instances of active region/area AA separate from second portions of two instances of active region/area AA overlapping/underlying metal region/segment M0.

IC layout/structure 300C also includes at least six instances of active region/area AA and two instances of via region/structure VD. Metal region/segment M0 and the two instances of via region/structure VD are thereby configured as an electrical path between first portions of two instances of active region/area AA separate from second portions of at least four instances of active region/area AA overlapping/underlying metal region/segment M0.

By including the electrical path including the corresponding metal region/segment M0 separate from the underlying instance or instances of active region/area AA, a circuit that includes one of IC layouts/structures 300A-300C is thereby capable of reducing the use of MD segments in electrical paths whereby the benefits discussed above with respect to IC layouts/structures 100A and 100B are obtained.

FIGS. 4-9 depict plan views of respective IC layouts/devices 400-900, in accordance with some embodiments. As discussed below, each of IC layouts/devices 400-900 is configured as a logic device or scan D flip-flop circuit including instances of metal region/segment M0 or pluralities of metal regions/segments 01-013 in accordance with one or more of the embodiments discussed above with respect to FIGS. 1A-3C.

Each of IC layouts/devices 400-900 includes some or all of active regions/areas AA1-AA4 extending in the X direction, metal regions/segments M0 or pluralities of metal regions/segments 01-013 or 01-012 extending in the Y direction and overlapping/overlying active regions/areas AA1-AA4, gate regions/structures GS or pluralities of gate regions/structures G1-G14 or G1-G13 extending in the Y direction and overlapping/overlying active regions/areas AA1-AA4, and some or all of backside power rails PR1-PR3.

Each of active regions/areas AA1 and AA4 is a p-type active region/area corresponding to PMOS transistors, and each of active regions/areas AA2 and AA3 is an n-type active region/area corresponding to NMOS transistors. Each of backside power rails PR1 and PR3 is configured to carry power supply voltage VDD, and backside power rail PR2 is configured to carry power supply reference voltage VSS.

Each plurality of gate regions/structures of pluralities of gate regions/structures G1-G14 includes from one to three gate regions/structures (not individually labeled) aligned in the Y direction and electrically separated in accordance with cut gate regions that are not depicted for the purpose of clarity. Each plurality of metal regions/segments of pluralities of metal regions/segments 01-013 includes from one to four metal regions/segments M0 (not individually labeled) aligned in the Y direction and electrically separated in accordance with cut metal regions that are not depicted for the purpose of clarity.

Each of IC layouts/devices 400-900 also includes instances of each of via regions/structures VD, VG, V0, and VB and metal regions/segments M1 extending in the X direction in the second metal layer. IC layout/device 900 also includes instances of metal regions/segments M2 extending in the Y direction in the third metal layer, and instances of via regions/structures V1. In each of FIGS. 8 and 9, a single one of each of via regions/structures VD, VG, V0, V1 (if present) and VB and metal regions/segments M1 and M2 (if present) is labeled for the purpose of clarity.

Figure 4:
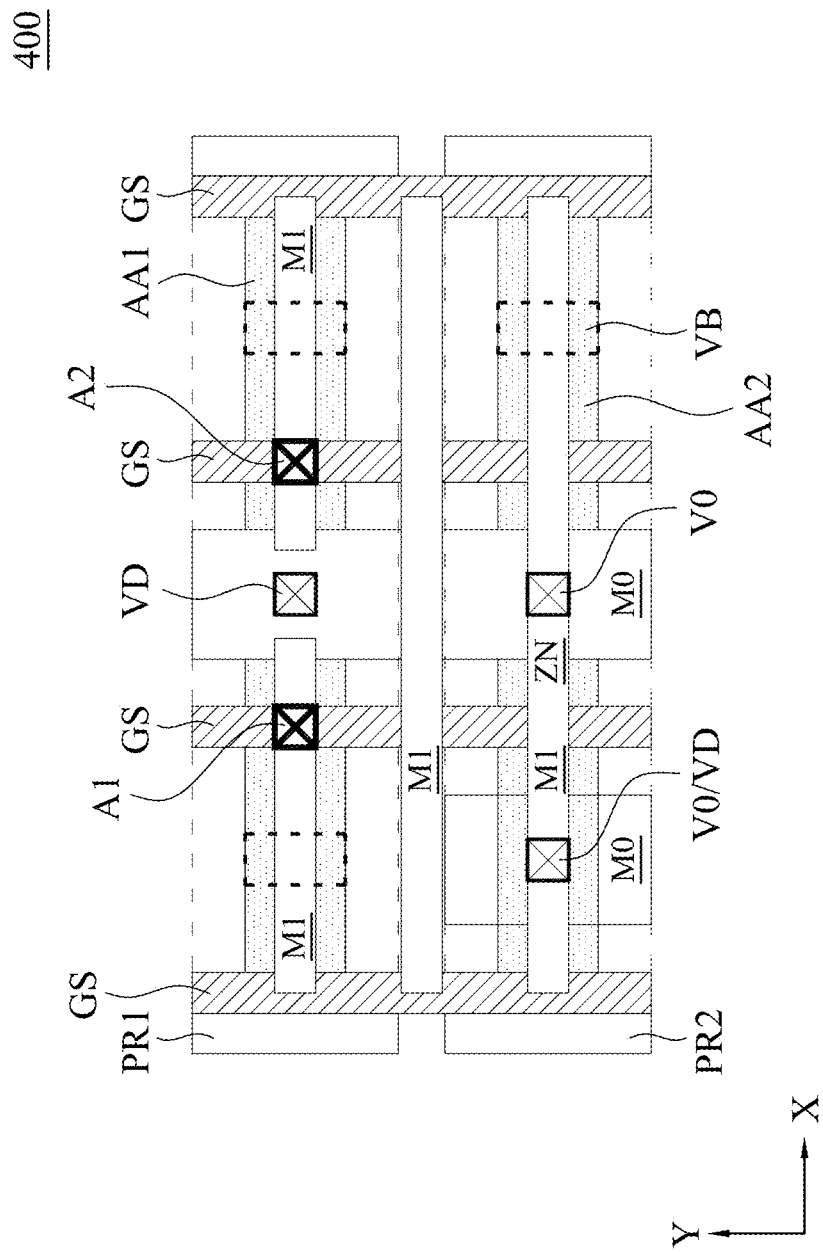
FIG. 4 is a diagram of a plan view of an IC layout diagram and corresponding IC device, in accordance with some embodiments.

As depicted in FIG. 4, the referenced features of IC layout/device 400 are configured as a NAND gate including instances of metal region/segment M1 arranged as input terminals configured to receive signals A1 and A2. NAND gate 400 is configured to generate a signal ZN based on signals A1 and A2 and includes an instance of metal region/segment M1 arranged as an output terminal configured to output signal ZN.

Figure 5:
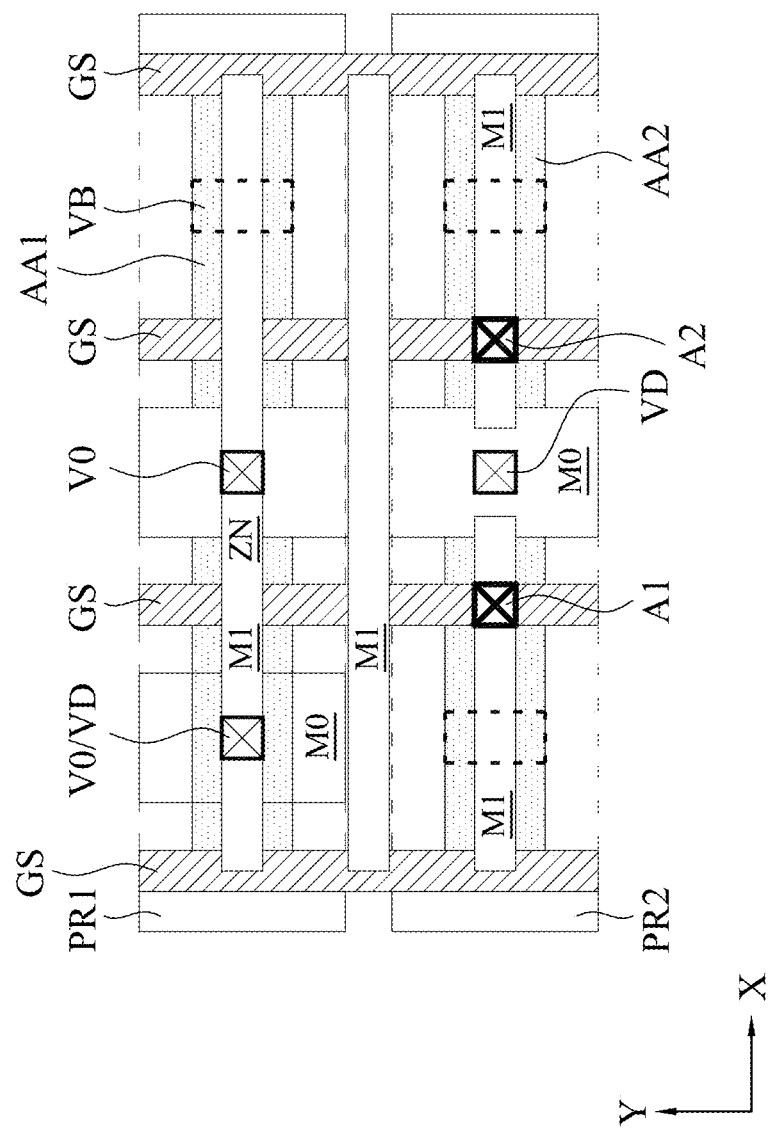
FIG. 5 is a diagram of a plan view of an IC layout diagram and corresponding IC device, in accordance with some embodiments.

As depicted in FIG. 5, the referenced features of IC layout/device 500 are configured as a NOR gate including instances of metal region/segment M1 arranged as input terminals configured to receive signals A1 and A2. NOR gate 500 is configured to generate signal ZN based on signals A1 and A2 and includes an instance of metal region/segment M1 arranged as an output terminal configured to output signal ZN.

Figure 6:
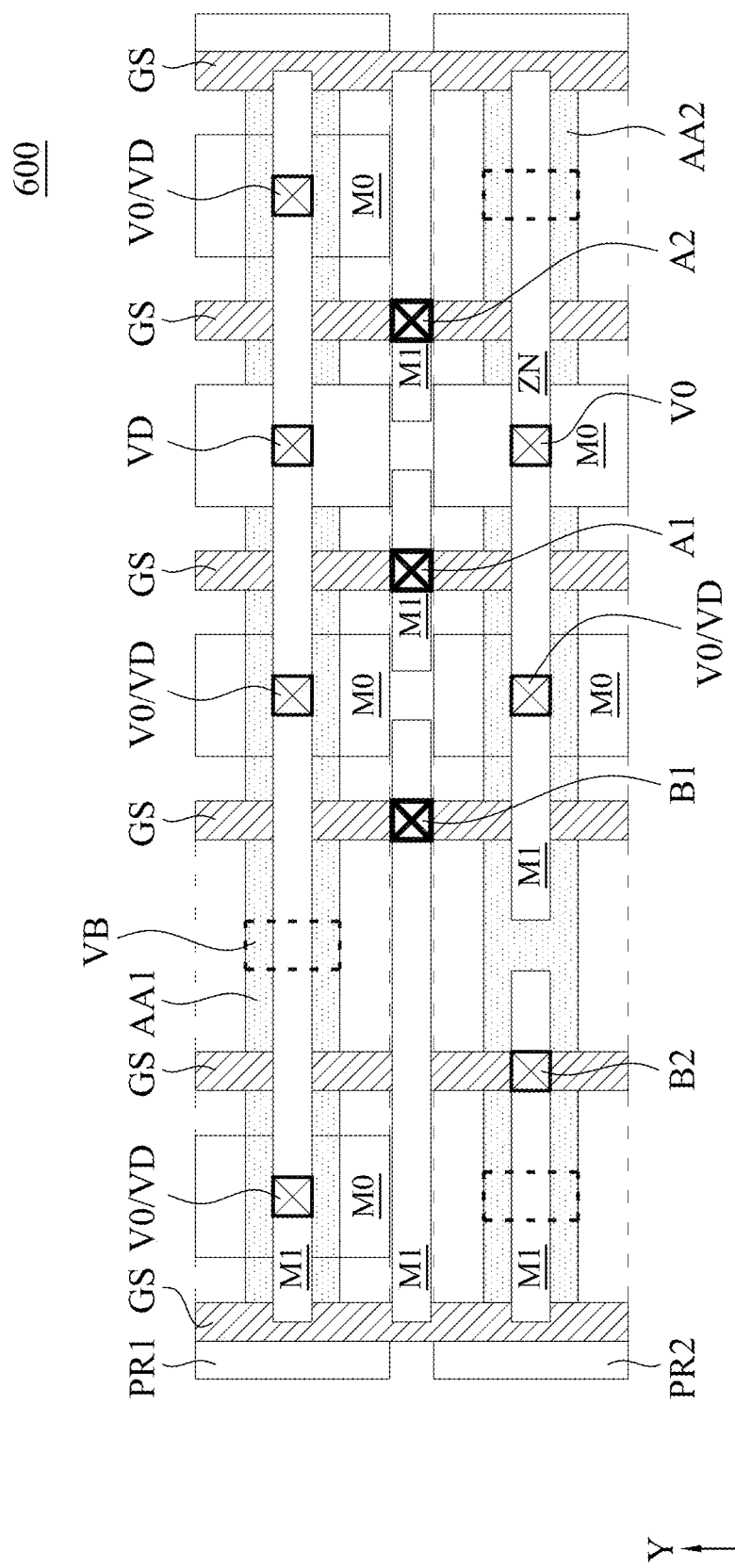
FIG. 6 is a diagram of a plan view of an IC layout diagram and corresponding IC device, in accordance with some embodiments.

As depicted in FIG. 6, the referenced features of IC layout/device 600 are configured as an and-or-invert (AOI) logic device including instances of metal region/segment M1 arranged as input terminals configured to receive signals A1, A2, B1, and B2. AOI device 600 is configured to generate signal ZN based on signals A1, A2, B1, and B2 and includes an instance of metal region/segment M1 arranged as an output terminal configured to output signal ZN.

Figure 7:
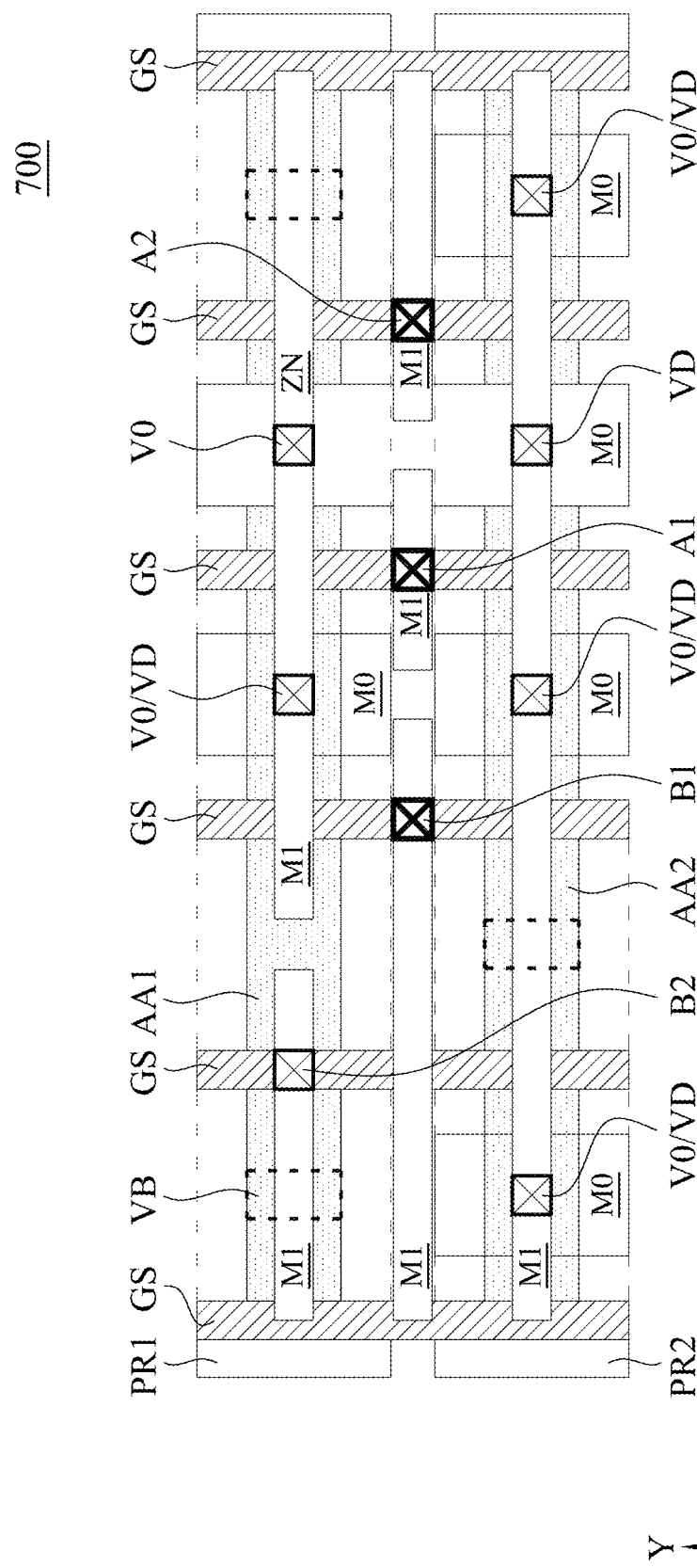
FIG. 7 is a diagram of a plan view of an IC layout diagram and corresponding IC device, in accordance with some embodiments.

As depicted in FIG. 7, the referenced features of IC layout/device 700 are configured as an or-and-invert (OAI)

logic device including instances of metal region/segment M1 arranged as input terminals configured to receive signals A1, A2, B1, and B2. OAI device 700 is configured to generate signal ZN based on signals A1, A2, B1, and B2 and includes an instance of metal region/segment M1 arranged as an output terminal configured to output signal ZN.

As depicted in FIGS. 4-7, each of IC layouts/devices 400-700 includes the instance of metal region/segment M1 arranged as the output terminal electrically connected to corresponding features and electrically isolated from an overlapping/overlying portion of active region/area AA1 or AA2 corresponding to a shared S/D terminal of two transistors (not labeled) included in the corresponding logic device.

Figure 8:
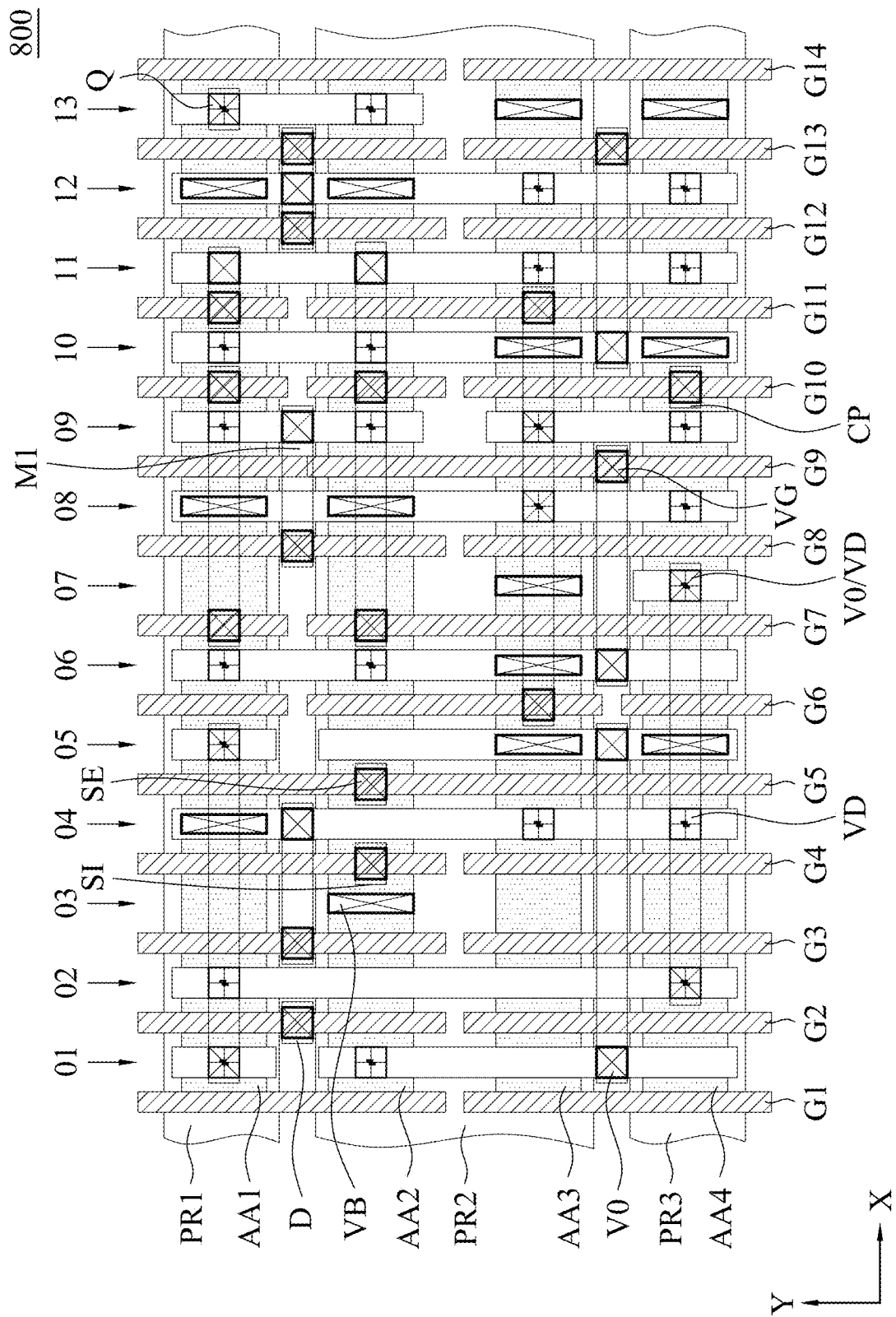
FIG. 8 is a diagram of a plan view of an IC layout diagram and corresponding IC device, in accordance with some embodiments.
Figure 9:
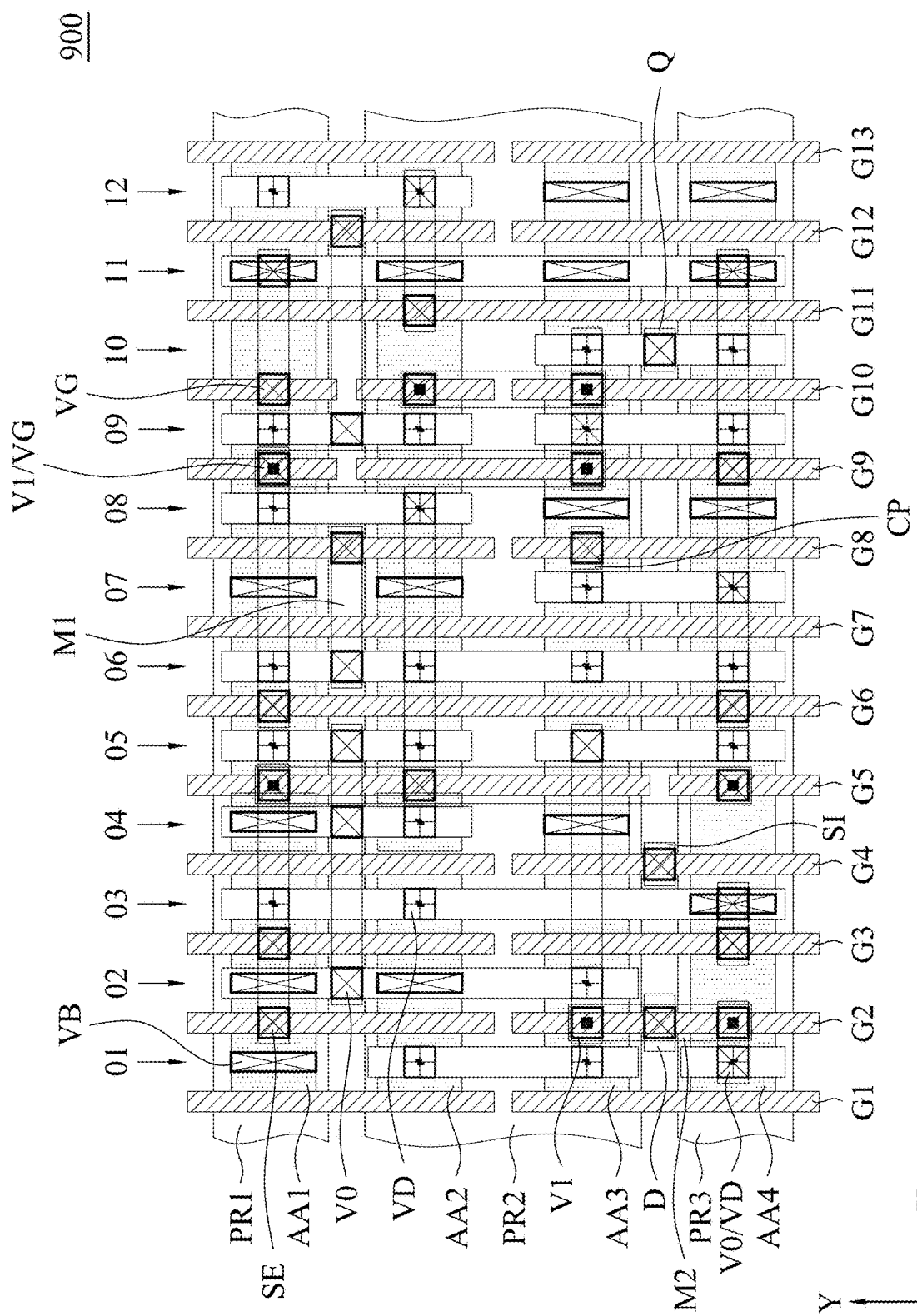
FIG. 9 is a diagram of a plan view of an IC layout diagram and corresponding IC device, in accordance with some embodiments.

As depicted in FIGS. 8 and 9, the referenced features of each of IC layouts/devices 800 and 900 are configured as a scan D flip-flop circuit including instances of metal region/segment M1 arranged as input terminals configured to receive a signal D (also referred to as a data signal in some embodiments), a signal SI (also referred to as a scan test signal in some embodiments), a signal SE (also referred to as an enable signal in some embodiments), and a signal CP (also referred to as a clock signal in some embodiments). Each of IC layouts/devices 800 and 900 is configured as depicted in FIGS. 8 and 9 to generate a signal Q (also referred to as an output signal in some embodiments) based on signals D, SI, SE, and CP, and includes an instance of metal region/segment M1 arranged as an output terminal configured to output signal Q.

As depicted in FIG. 8, IC layout/device 800 includes a metal region/segment M0 configured as a separated electrical path (also referred to as a fly connection in some embodiments), as discussed above, in each of pluralities of metal regions/segments 01, 02, 04-06, 08, and 010-012.

As depicted in FIG. 9, IC layout/device 900 includes a metal region/segment M0 configured as a separated electrical path, as discussed above, in each of pluralities of metal regions/segments 03, 05, and 011.

IC layout/device 800 thereby includes a total of 14 pluralities of gate regions/structures G1-G14 and a total of four active regions/areas AA1-AA4 corresponding to a total gate pitch (also referred to as a poly pitch in some embodiments) of 26, and is free from including instances of metal regions/segments M2 extending in the Y direction in the third metal layer.

IC layout/device 900 thereby includes a total of 13 pluralities of gate regions/structures G1-G13 and a total of four active regions/areas AA1-AA4 corresponding to a total gate pitch of 24, and includes four instances of metal regions/segments M2 extending in the Y direction in the third metal layer. Compared to IC layout/device 800, IC layout/device 900 has a smaller area and potentially higher costs based on including the instances of metal regions/segments M2 in the third metal layer.

By the configurations discussed above, each of IC layouts/devices 400-900 includes electrical paths including the corresponding metal regions/segments M0 or pluralities of metal regions/segments 01-013 separate from the corresponding underlying ones of active regions/areas AA1-AA4 and is thereby capable of reducing the use of metal segments, e.g., MD segments, in electrical paths whereby the benefits discussed above with respect to IC layouts/structures 100A-300C are obtained.

FIG. 10 is a flowchart of a method 1000 of manufacturing an IC structure, in accordance with some embodiments. Method 1000 is operable to form one or more of IC structures 100A-300C or IC devices 400-900 discussed above with respect to FIGS. 1A-9.

In some embodiments, the operations of method 1000 are performed in the order depicted in FIG. 10. In some embodiments, the operations of method 1000 are performed in an order other than the order depicted in FIG. 10 and/or two or more operations of method 1000 are performed simultaneously. In some embodiments, one or more additional operations are performed before, during, and/or after the operations of method 1000. In some embodiments, performing some or all of the operations of method 1000 includes performing one or more operations as discussed below with respect to IC manufacturing system 1300 and FIG. 13.

At operation 1010, in some embodiments, first and second active areas extending in a first direction in the semiconductor substrate are formed. In some embodiments, forming the first and second active areas includes forming two or more instances of active area AA discussed above with respect to FIGS. 1A-3C. In some embodiments, forming the first and second active areas includes forming two or more of active areas AA1-AA4 discussed above with respect to FIGS. 4-9.

In some embodiments, forming the first and second active areas includes performing one or more implantation processes in areas of a semiconductor substrate corresponding to the first and second active areas, whereby predetermined doping concentrations and types are achieved for one or more given dopants as discussed above.

In some embodiments, forming the first and second active areas includes forming a plurality of S/D structures in and/or on some or all of the active areas of the corresponding active areas, e.g., by performing one or more implantation processes and/or one or more deposition processes.

At operation 1020, in some embodiments, first and second gate structures extending in a second direction and overlying each of the first and second active areas are constructed. In some embodiments, constructing the first and second gate structures includes constructing two or more instances of gate structure GS discussed above with respect to FIGS. 1A-7. In some embodiments, constructing the first and second gate structures includes constructing some or all of pluralities of gate structures G1-G14 discussed above with respect to FIGS. 8 and 9.

In some embodiments, constructing the first and second gate structures includes performing a plurality of manufacturing operations, e.g., one or more of a lithography, diffusion, deposition, etching, planarizing, or other operation suitable for constructing the first and second gate structures as discussed above.

At operation 1030, S/D via structures are formed on a portion of the first active area between the first and second gate structures and on a portion of the second active area extending away from the first and second gate structure. In some embodiments, forming the S/D via structures includes forming two or more instances of via structure VD on the corresponding portions of active areas AA or AA1-AA4 as discussed above with respect to FIGS. 1A-9.

In some embodiments, forming the S/D via structures includes forming the S/D via structures directly on the corresponding portions of the active areas.

In some embodiments, forming a via structure, metal segment, or backside power rail includes performing a plurality of manufacturing operations including depositing and patterning one or more photoresist layers, performing one or more etching processes, and performing one or more deposition processes whereby one or more conductive materials are configured to form a continuous, low resistance structure.

At operation 1040, an electrical connection between the corresponding portions of the first and second active areas is constructed. The electrical connection is electrically isolated from a portion of the second active area between the first and second gate structures.

Constructing the electrical connection includes forming a first metal segment extending in the second direction in a first metal layer and overlying each of the first S/D via structure and the second active area, forming a second metal segment in the first metal layer overlying the second S/D via structure, forming first and second via structures overlying the respective first and second metal segments, and forming a third metal segment extending in the first direction in a second metal layer and overlying each of the first and second via structures, thereby electrically connecting the portion of the first active area to the portion of the second active area. Forming the first metal segment overlying the second active area includes forming the first metal segment electrically isolated from the portion of the second active area between the first and second gate structures.

In various embodiments, the portion of the second active area between the first and second gate structures includes a shared S/D terminal of a transistor series or an electrical connection to a power supply.

In some embodiments, constructing the electrical path includes forming the corresponding metal segments and via structures in accordance with the various embodiments discussed above with respect to FIGS. 1A-9.

In some embodiments, forming the first metal segment overlying each of the first and second active areas includes forming the first metal segment overlying more than two instances of active area AA as discussed above with respect to FIGS. 3A-3C.

In some embodiments, constructing the electrical path includes performing one or more patterning, photoresist, etching, or deposition processes, or other processes suitable for forming a low resistance path as discussed above.

At operation 1050, a SAC via structure overlying one of the first or second gate structures is formed. In some embodiments, forming the SAC via structure includes forming a metal segment in the second metal layer electrically connected to the SAC via structure. In some embodiments, forming the SAC via structure includes forming via structure VG as discussed above with respect to FIGS. 1A-9.

At operation 1060, in some embodiments, one or more of additional active areas, additional gate structures, additional metal segments, via structures, or backside power rails are formed. In some embodiments, forming the one or more of additional active areas, additional gate structures, additional metal segments, via structures, or backside power rails includes forming some or all of the one or more additional features simultaneously with performing a corresponding one or more of operations 1010-1050, e.g., forming active areas AA3 and AA4 simultaneously with forming active areas AA1 and AA2 in operation 1010.

In some embodiments, forming one or more via structures or backside power rails includes forming a via structure extending from the portion of the first active area between the first and second gate structures to a back side of the semiconductor substrate and constructing a power rail in the back side of the semiconductor substrate electrically connected to the via structure. In some embodiments, forming one or more via structures or backside power rails includes forming one or more via structures VB and one or more power rails PR or PR1-PR3 as discussed above with respect to FIGS. 1B-9.

In some embodiments, forming the one or more of additional active areas, additional gate structures, additional metal segments, via structures, or backside power rails includes forming a logic device or circuit, e.g., one of IC devices 400-900 discussed above with respect to FIGS. 4-9.

In some embodiments, forming the one or more of additional active areas, additional gate structures, additional metal segments, via structures, or backside power rails is part of building a plurality of IC devices, e.g., transistors, logic gates, memory cells, interconnect structures, and/or other suitable devices, by performing a plurality of manufacturing operations, e.g., one or more of a lithography, diffusion, deposition, etching, planarizing, or other operation suitable for building the plurality of IC devices in the semiconductor substrate.

By performing some or all of the operations of method 1000, an IC structure is manufactured in which an electrical path includes a metal segment in a first metal layer aligned with gate structures and electrically isolated from a shared S/D structure of a transistor series or a power rail connection, thereby obtaining the benefits discussed above with respect to IC structures 100A-300C and IC devices 400-900.

Figure 11:
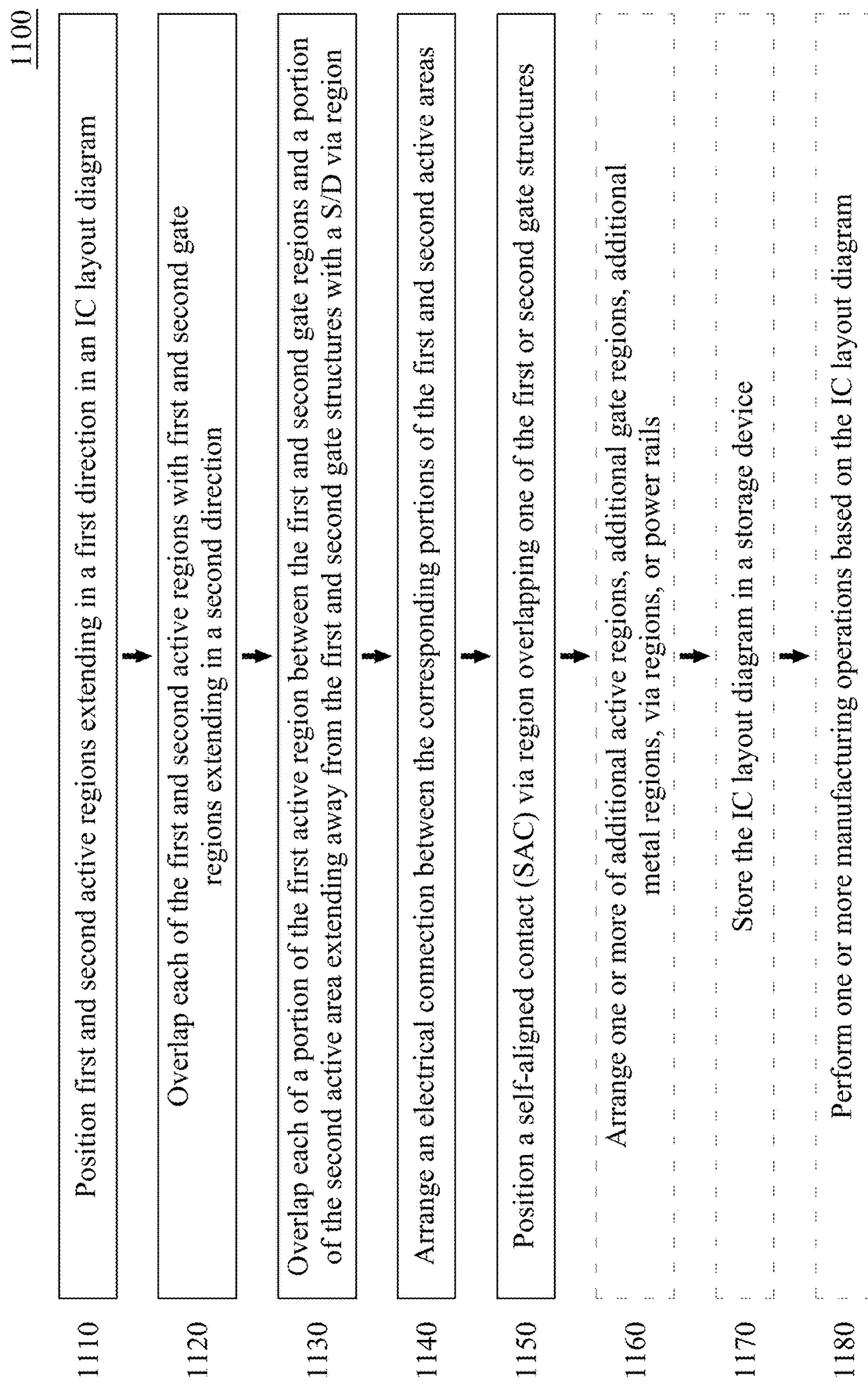
FIG. 11 is a flowchart of a method of generating an IC layout diagram, in accordance with some embodiments.

FIG. 11 is a flowchart of a method 1100 of generating an IC layout diagram, e.g., an IC layout diagram 100A-900 discussed above with respect to FIGS. 1A-9, in accordance with some embodiments.

In some embodiments, generating the IC layout diagram includes generating the IC layout diagram corresponding to an IC structure or device, e.g., an IC structure 100A-300C or device 400-900 discussed above with respect to FIGS. 1A-9, manufactured based on the generated IC layout diagram.

In some embodiments, some or all of method 1100 is executed by a processor of a computer, e.g., a processor 1202 of an IC layout diagram generation system 1200, discussed below with respect to FIG. 12.

Some or all of the operations of method 1100 are capable of being performed as part of a design procedure performed in a design house, e.g., a design house 1320 discussed below with respect to FIG. 13.

In some embodiments, the operations of method 1100 are performed in the order depicted in FIG. 11. In some embodiments, the operations of method 1100 are performed simultaneously and/or in an order other than the order depicted in FIG. 11. In some embodiments, one or more operations are performed before, between, during, and/or after performing one or more operations of method 1100.

At operation 1110, first and second active regions extending in a first direction are positioned in an IC layout diagram. In some embodiments, positioning the first and second active regions includes positioning two or more instances of active region AA discussed above with respect to FIGS. 1A-3C. In some embodiments, positioning the first and second active regions includes positioning two or more of active regions AA1-AA4 discussed above with respect to FIGS. 4-9.

At operation 1120, each of the first and second active regions is overlapped with first and second gate regions extending in a second direction. In some embodiments, overlapping the first and second active regions with first and second gate regions includes overlapping active regions AA with two or more instances of gate region GS discussed above with respect to FIGS. 1A-3C. In some embodiments, overlapping the first and second active regions with first and second gate regions includes overlapping two or more of active regions AA1-AA4 with pluralities of gate structures G1-G14 discussed above with respect to FIGS. 4-9.

At operation 1130, each of a portion of the first active region between the first and second gate regions and a portion of the second active region extending away from the first and second gate regions is overlapped with a S/D via region. In some embodiments, overlapping each of the portion of the first active region between the first and second gate regions and the portion of the second active region extending away from the first and second gate regions with the S/D via region includes overlapping two or more instances of via region VD with the corresponding portions of active regions AA or AA1-AA4 as discussed above with respect to FIGS. 1A-9.

In some embodiments, overlapping the active regions with the S/D via regions is free from overlapping the S/D via regions with MD regions.

At operation 1140, an electrical connection between the corresponding portions of the first and second active areas is arranged. Arranging the electrical connection includes positioning a first metal region extending in the second direction in a first metal layer and overlapping each of the first S/D via structure and the second active region, positioning a second metal region in the first metal layer overlapping the second S/D via region, positioning first and second via regions overlapping the respective first and second metal regions, and positioning a third metal region extending in the first direction in a second metal layer and overlapping each of the first and second via regions, thereby electrically connecting the portion of the first active region to the portion of the second active region. Positioning the first metal region overlapping the second active region includes positioning the first metal region electrically isolated from the portion of the second active region between the first and second gate regions.

In various embodiments, the portion of the second active region between the first and second gate structures includes a shared S/D terminal of a transistor series or an electrical connection to a power supply.

In some embodiments, arranging the electrical path includes arranging the corresponding metal and via regions in accordance with the various embodiments discussed above with respect to FIGS. 1A-9.

In some embodiments, arranging the electrical connection includes positioning the first metal region overlapping more than two instances of active region AA as discussed above with respect to FIGS. 3A-3C.

At operation 1150, a SAC via region is positioned overlapping one of the first or second gate structures. In some embodiments, positioning the SAC via region includes positioning a metal region in the second metal layer electrically connected to the SAC via region. In some embodiments, positioning the SAC via region includes positioning via region VG as discussed above with respect to FIGS. 1A-9.

At operation 1160, in some embodiments, one or more additional active regions, additional gate regions, additional metal regions, via regions, or power rails are arranged.

In some embodiments, arranging one or more additional via regions or power rails includes positioning a via region extending from the portion of the first active region between the first and second gate region to a back side of the semiconductor substrate and positioning a power rail in the back side of the semiconductor substrate electrically connected to the via region. In some embodiments, positioning one or more via regions or backside power rails includes positioning one or more via regions VB and one or more power rails PR or PR1-PR3 as discussed above with respect to FIGS. 1A-9.

In some embodiments, arranging one or more of additional active regions, additional gate regions, additional metal regions, via regions, or power rails includes forming a logic device or circuit, e.g., one of IC devices 400-900 discussed above with respect to FIGS. 4-9.

At operation 1170, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in layout library 1207 or over network 1214 of IC layout diagram generation system 1200, discussed below with respect to FIG. 12.

At operation 1180, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed above with respect to FIG. 10 and below with respect to FIG. 13.

By executing some or all of the operations of method 1100, an IC layout diagram is generated corresponding to an IC structure in which an electrical path includes a metal segment in a first metal layer aligned with gate structures and electrically isolated from a shared S/D structure of a transistor series or a power rail connection, thereby obtaining the benefits discussed above with respect to IC structures 100A-300C and IC devices 400-900.

Figure 12:
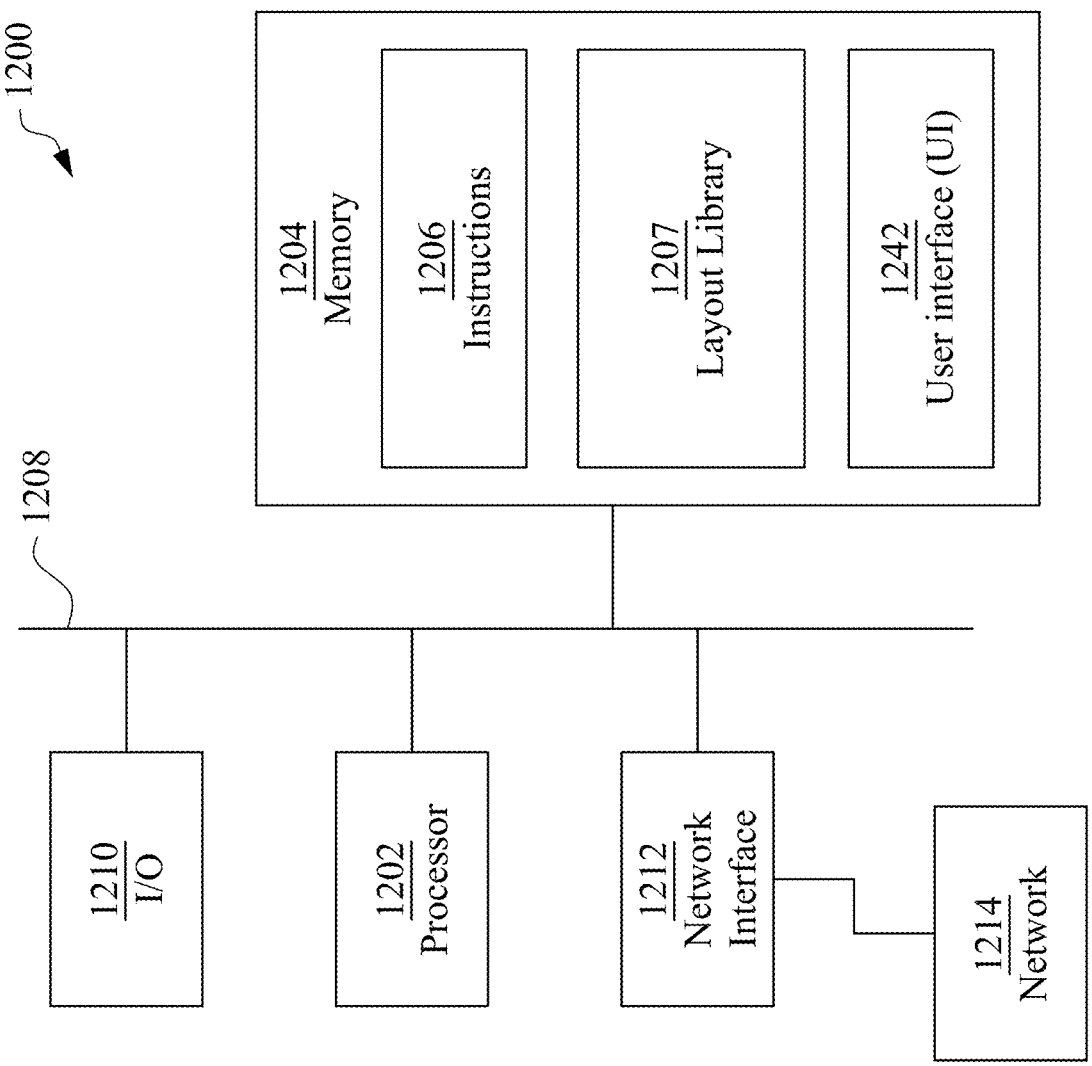
FIG. 12 is a block diagram of an IC layout diagram generation system, in accordance with some embodiments.

FIG. 12 is a block diagram of IC layout diagram generation system 1200, in accordance with some embodiments. Methods described herein of designing IC layout diagrams in accordance with one or more embodiments are implementable, for example, using IC layout diagram generation system 1200, in accordance with some embodiments.

In some embodiments, IC layout diagram generation system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of a method, e.g., method 1100 of generating an IC layout diagram described above with respect to FIG. 11 (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause IC layout diagram generation system 1200 to be usable for performing a portion or all of the noted processes and/or methods. In one or more embodiments, processor 1202 is a central processing unit (CPU), a multiprocessor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, computer-readable storage medium 1204 stores computer program code 1206 configured to cause IC layout diagram generation system 1200 (where such execution represents (at least in part) the EDA tool) to be usable for performing a portion or all of the noted processes and/or methods. In one or more embodiments, computer-readable storage medium 1204 also stores information which facilitates performing a portion or all of the noted processes and/or methods. In one or more embodiments, computer-readable storage medium 1204 stores a layout library 1207 of IC layouts including such layouts as disclosed herein, e.g., IC layouts 100A-900 discussed above with respect to FIGS. 1A-9.

IC layout diagram generation system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

IC layout diagram generation system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 1200.

IC layout diagram generation system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. IC layout diagram generation system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
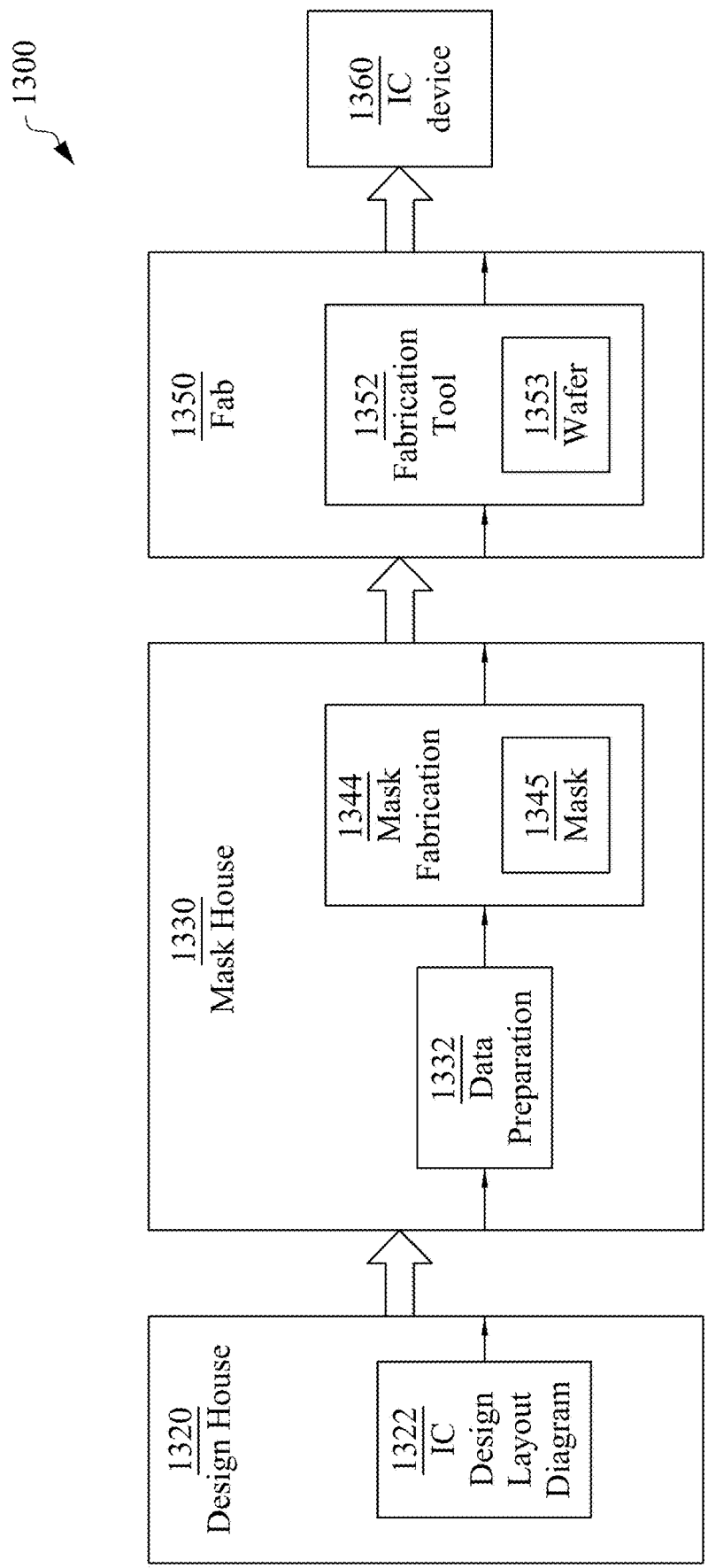
FIG. 13 is a block diagram of an IC manufacturing system, and an IC manufacturing flow associated therewith, in accordance with some embodiments.

FIG. 13 is a block diagram of IC manufacturing system 1300, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns, e.g., a layout 100A-900 discussed above with respect to FIGS. 1A-9. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file (RDF). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 includes wafer fabrication tools 1352 configured to execute various manufacturing operations on semiconductor wafer 1353 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

In some embodiments, an IC structure includes first and second active areas extending in a first direction in a semiconductor substrate, first and second gate structures extending in a second direction perpendicular to the first direction, wherein each of the first and second gate structures overlies each of the first and second active areas, a first metal segment extending in the second direction in a first metal layer, wherein the first metal segment overlies each of the first and second active areas between the first and second gate structures, second and third metal segments extending in the first direction in a second metal layer, wherein the second metal segment overlies each of the first active area and the first metal segment and is electrically connected to the first metal segment, and a gate via structure extending from the third metal segment to one of the first or second gate structures. The first and second metal segments are electrically connected to the second active area, electrically isolated from a first portion of the first active area between the first and second gate structures, and electrically connected to a second portion of the first active area extending beyond the first and second gate structures.

In some embodiments, an IC device includes a plurality of active areas extending in a first direction in a semiconductor substrate, a plurality of gate structures extending in a second direction perpendicular to the first direction, wherein the plurality of gate structures overlies the plurality of active areas, a first plurality of metal segments extending in the second direction in a first metal layer, wherein a first metal segment of the first plurality of metal segments overlies first and second active areas of the plurality of active areas, a second plurality of metal segments extending in the first direction in a second metal layer, wherein a first metal segment of the second plurality of metal segments overlies each of the first metal segment of the first plurality of metal segments and the first active area of the plurality of active areas, and is electrically connected to the first metal segment of the first plurality of metal segments, and a gate via structure extending from a second metal segment of the second plurality of metal segments to a second gate structure of the plurality of gate structures. The first metal segments of each of the first and second pluralities of metal segments are electrically connected to the second active area of the plurality of active areas, electrically isolated from a first portion of the first active area of the plurality of active areas adjacent to a second gate structure of the plurality of gate structures, and electrically connected to a second portion of the first active area of the plurality of active areas.

In some embodiments, a method of manufacturing an IC structure includes, in a semiconductor substrate, forming first and second active areas extending in a first direction, constructing first and second gate structures extending in a second direction perpendicular to the first direction, wherein each of the first and second gate structures overlies each of the first and second active areas, forming a first S/D via structure on a portion of the first active area between the first and second gate structures, forming a second S/D via structure on a portion of the second active area extending away from the first and second gate structures, forming a first metal segment extending in the second direction in a first metal layer and overlying each of the first S/D via structure and the second active area, forming a second metal segment in the first metal layer overlying the second S/D via structure, forming first and second via structures overlying the respective first and second metal segments, forming a SAC via structure overlying one of the first or second gate structures, forming a third metal segment extending in the first direction in a second metal layer and overlying each of the first and second via structures, thereby electrically connecting the portion of the first active area to the portion of the second active area, and forming a fourth metal segment extending in the first direction in the second metal layer and on the SAC via structure.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) structure comprising:
   first and second active areas extending in a first direction in a semiconductor substrate;
   first and second gate structures extending in a second direction perpendicular to the first direction, wherein each of the first and second gate structures overlies each of the first and second active areas;
   a first metal segment extending in the second direction in a first metal layer, wherein the first metal segment overlies each of the first and second active areas between the first and second gate structures;
   second and third metal segments extending in the first direction in a second metal layer, wherein the second metal segment overlies each of the first active area and the first metal segment and is electrically connected to the first metal segment; and
   a gate via structure extending from the third metal segment to one of the first or second gate structures,
   wherein the first and second metal segments are electrically connected to the second active area, electrically isolated from a first portion of the first active area between the first and second gate structures, and electrically connected to a second portion of the first active area extending beyond the first and second gate structures.

2. The IC structure of claim 1, wherein
   the first metal segment is electrically connected to the second active area through a source/drain via structure in direct contact with the second active area.

3. The IC structure of claim 1, wherein
   the second metal segment is electrically connected to the second portion of the first active area through a first metal layer via structure, a fourth metal segment in the first metal layer, and a source/drain via structure in direct contact with the second portion of the first active area.

4. The IC structure of claim 1, wherein
   the first gate structure and the first active area are configured as a first transistor,
   the second gate structure and the first active area are configured as a second transistor, and
   the first portion of the first active area comprises a shared source/drain terminal of the first and second transistors.

5. The IC structure of claim 1, further comprising:
   a power rail positioned in a back side of the semiconductor substrate; and
   a via structure configured to electrically connect the power rail to the first portion of the first active area.

6. The IC structure of claim 1, wherein
   the first metal segment is electrically connected to a portion of the second active area between the first and second gate structures.

7. The IC structure of claim 6, further comprising:
a fourth metal segment extending in the first direction in the second metal layer, wherein the fourth metal segment overlies and is electrically isolated from each of the portion of the second active area and the first metal segment.

8. The IC structure of claim 1, further comprising:
a third active area extending between the first and second active areas, wherein the first and second metal segments are electrically isolated from a third portion of the third active area between the first and second gate structures.

9. The IC structure of claim 1, wherein the third metal segment overlies the first metal segment.

10. An integrated circuit (IC) device comprising:
a plurality of active areas extending in a first direction in a semiconductor substrate;
a plurality of gate structures extending in a second direction perpendicular to the first direction, wherein the plurality of gate structures overlies the plurality of active areas;
a first plurality of metal segments extending in the second direction in a first metal layer, wherein a first metal segment of the first plurality of metal segments overlies first and second active areas of the plurality of active areas;
a second plurality of metal segments extending in the first direction in a second metal layer, wherein a first metal segment of the second plurality of metal segments overlies each of the first metal segment of the first plurality of metal segments and the first active area of the plurality of active areas, and is electrically connected to the first metal segment of the first plurality of metal segments; and
a gate via structure extending from a second metal segment of the second plurality of metal segments to a second gate structure of the plurality of gate structures,
wherein the first metal segments of each of the first and second pluralities of metal segments are electrically connected to the second active area of the plurality of active areas, electrically isolated from a first portion of the first active area of the plurality of active areas adjacent to the second gate structure of the plurality of gate structures, and electrically connected to a second portion of the first active area of the plurality of active areas.

11. The IC device of claim 10, wherein
the first metal segment of the first plurality of metal segments is electrically connected to the second active area of the plurality of active areas through a first source/drain (S/D) via structure in direct contact with the second active area of the plurality of active areas, and
the first metal segment of the second plurality of metal segments is electrically connected to the second portion of the first active area of the plurality of active areas through a first metal layer via structure, a second metal segment of the first plurality of metal segments, and a second S/D via structure in direct contact with the second portion of the first active area of the plurality of active areas.

12. The IC device of claim 11, further comprising:
a plurality of power rails positioned in a back side of the semiconductor substrate; and
a plurality of back-side via structures configured to electrically connect the plurality of active areas to the plurality of power rails,
wherein the first portion of the first active area of the plurality of active areas comprises a shared S/D terminal of a transistor series coupled between first and second power rails of the plurality of power rails.

13. The IC device of claim 12, wherein
the gate via structure is one of two gate via structures extending from the second plurality of metal segments to the plurality of gate structures, and
the plurality of active areas, the plurality of gate structures, the two gate via structures, the first and second pluralities of metal segments, the first and second S/D via structures, the plurality of power rails, and the plurality of back-side via structures are configured as one of a NAND gate or a NOR gate.

14. The IC device of claim 12, wherein
the gate via structure is one of four gate via structures extending from the second plurality of metal segments to the plurality of gate structures, and
the plurality of active areas, the plurality of gate structures, the four gate via structures, the first and second pluralities of metal segments, the first and second S/D via structures, the plurality of power rails, and the plurality of back-side via structures are configured as one of an and-or-invert (AOI) logic device or an or-and-invert (OAI) logic device.

15. The IC device of claim 12, wherein
the gate via structure is one gate via structure of a plurality of gate via structures extending from the second plurality of metal segments to the plurality of gate structures, and
the plurality of active areas, the plurality of gate structures, the plurality of gate via structures, the first and second pluralities of metal segments, the first and second S/D via structures, the plurality of power rails, and the plurality of back-side via structures are configured as a flip-flop circuit.

16. The IC device of claim 12, wherein
the gate via structure is one gate via structure of a plurality of gate via structures extending from the second plurality of metal segments to the plurality of gate structures,
the IC device further comprises a third plurality of metal segments extending in the second direction in a third metal layer overlying the second metal layer, and
the plurality of active areas, the plurality of gate structures, the plurality of gate via structures, the first through third pluralities of metal segments, the first and second S/D via structures, the plurality of power rails, and the plurality of back-side via structures are configured as a flip-flop circuit.

17. An integrated circuit (IC) structure comprising:
first and second active areas extending in a first direction in a semiconductor substrate;
first and second gate structures extending in a second direction perpendicular to the first direction, wherein each of the first and second gate structures overlies each of the first and second active areas;
a first metal segment extending in the second direction in a first metal layer, wherein the first metal segment overlies each of the first and second active areas between the first and second gate structures;
a first source/drain (S/D) via structure extending from the first metal segment to the second active area;
second and third metal segments extending in the first direction in a second metal layer, wherein the second metal segment overlies each of the first active area and the first metal segment and is electrically connected to the first metal segment;

a first metal layer via structure, a fourth metal segment in the first metal layer, and a second S/D via structure extending from the second metal segment to a first portion of the first active area extending beyond the first and second gate structures; and a gate via structure extending from the third metal segment to one of the first or second gate structures, wherein the first and second metal segments are electrically isolated from a second portion of the first active area between the first and second gate structures.

18. The IC structure of claim 17, wherein the first gate structure and the first active area are configured as a first transistor, the second gate structure and the first active area are configured as a second transistor, and the second portion of the first active area comprises a shared S/D terminal of the first and second transistors.

19. The IC structure of claim 17, further comprising:

a power rail positioned in a back side of the semiconductor substrate; and a via structure extending from the power rail to the second portion of the first active area.

20. The IC structure of claim 17, wherein the second metal segment overlies the first gate structure, and the gate via structure extends from the third metal segment to the first gate structure between the first and second active areas.

* * * * *